(12) United States Patent
McDonald et al.

(10) Patent No.: US 12,213,227 B2
(45) Date of Patent: Jan. 28, 2025

(54) CONTROL DEVICE HAVING BUTTONS WITH MULTIPLE-LEVEL BACKLIGHTING

(71) Applicant: Lutron Technology Company LLC, Coopersburg, PA (US)

(72) Inventors: Matthew Philip McDonald, Phoenixville, PA (US); Daniel L. Twaddell, Bethlehem, PA (US); Jason C. Killo, Emmaus, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 18/473,407

(22) Filed: Sep. 25, 2023

(65) Prior Publication Data

US 2024/0015870 A1 Jan. 11, 2024

Related U.S. Application Data

(63) Continuation of application No. 17/744,850, filed on May 16, 2022, now Pat. No. 11,805,589, which is a
(Continued)

(51) Int. Cl.
*H05B 47/11* (2020.01)
*H01H 13/70* (2006.01)
(Continued)

(52) U.S. Cl.
CPC ............. *H05B 47/11* (2020.01); *H01H 13/70* (2013.01); *H05B 45/12* (2020.01); *H05B 47/10* (2020.01);
(Continued)

(58) Field of Classification Search
CPC ........ H05B 47/11; H05B 45/12; H05B 47/10; H01H 13/70; H01H 2219/039; H03K 17/9631; Y02B 20/40
See application file for complete search history.

(56) References Cited

U.S. PATENT DOCUMENTS 5,569,939 A 10/1996 Choi
6,236,331 B1 * 5/2001 Dussureault ........... H05B 45/58
340/916
(Continued)

FOREIGN PATENT DOCUMENTS

EP 1628459 A1 2/2006

*Primary Examiner* — Renan Luque
(74) *Attorney, Agent, or Firm* — Michael S. Czarnecki; Glen R. Farbanish; Philip N. Smith

(57) ABSTRACT

A control device may have a plurality of buttons that may be backlit to multiple levels, such as first, second, and third adjacent buttons positioned in order, and first, second, and third LEDs positioned to illuminate a respective button. The control device may be configured to illuminate the first LED to a first LED illumination intensity to illuminate the respective button to a first surface illumination intensity; illuminate the third LED to a second LED illumination intensity to illuminate the respective button to a second surface illumination intensity; and illuminate the second LED to a third LED illumination intensity to illuminate the respective button to the second surface illumination intensity. The third LED illumination intensity may be less than the second LED illumination intensity, which may be less than the first LED illumination intensity, and the second surface illumination intensity may be less than the first surface illumination intensity.

18 Claims, 6 Drawing Sheets

Related U.S. Application Data continuation of application No. 17/082,567, filed on Oct. 28, 2020, now Pat. No. 11,337,287, which is a continuation of application No. 16/783,682, filed on Feb. 6, 2020, now Pat. No. 10,827,576, which is a continuation of application No. 16/574,045, filed on Sep. 17, 2019, now Pat. No. 10,595,374, which is a continuation of application No. 16/244,556, filed on Jan. 10, 2019, now Pat. No. 10,455,660, which is a continuation of application No. 15/952,869, filed on Apr. 13, 2018, now Pat. No. 10,206,260, which is a continuation of application No. 15/680,516, filed on Aug. 18, 2017, now Pat. No. 9,980,335, which is a continuation of application No. 14/850,315, filed on Sep. 10, 2015, now Pat. No. 9,763,302.

(60) Provisional application No. 62/166,204, filed on May 26, 2015, provisional application No. 62/048,658, filed on Sep. 10, 2014.

(51) Int. Cl.
*H03K 17/96* (2006.01)
*H05B 45/12* (2020.01)
*H05B 47/10* (2020.01)

(52) U.S. Cl.
CPC ... *H01H 2219/039* (2013.01); *H03K 17/9631* (2013.01); *Y02B 20/40* (2013.01)

(56) References Cited

U.S. PATENT DOCUMENTS

| | | |
|---|---|---|
| 6,803,728 B2 | 10/2004 | Balasubramaniam et al. |
| 7,135,664 B2 | 11/2006 | Vornsand et al. |
| 7,333,031 B1 | 2/2008 | Banter |
| 7,361,853 B2 | 4/2008 | Clegg et al. |
| 7,414,210 B2 | 8/2008 | Clegg et al. |
| 7,432,460 B2 | 10/2008 | Clegg et al. |
| 7,432,463 B2 | 10/2008 | Clegg et al. |
| 7,786,623 B2 | 8/2010 | Carpenter et al. |
| 7,796,057 B2 | 9/2010 | Swatsky et al. |
| 7,825,891 B2 | 11/2010 | Yao et al. |
| 8,009,042 B2 | 8/2011 | Steiner et al. |
| 8,031,164 B2 | 10/2011 | Herz et al. |
| 8,077,058 B2 | 12/2011 | Swatsky et al. |
| 8,102,375 B1 | 1/2012 | Feldstein et al. |
| 8,194,031 B2 | 6/2012 | Yao et al. |
| 8,451,116 B2 | 5/2013 | Steiner et al. |
| 8,698,727 B2 | 4/2014 | Herz et al. |
| 8,698,792 B2 | 4/2014 | Chang et al. |
| 9,763,302 B2 * | 9/2017 | McDonald ............ H01H 13/70 |
| 9,980,335 B2 * | 5/2018 | McDonald ............ H05B 45/12 |
| 10,206,260 B2 * | 2/2019 | McDonald ............ H05B 45/12 |
| 10,455,660 B2 * | 10/2019 | McDonald ............ H05B 47/11 |
| 10,595,374 B2 * | 3/2020 | McDonald ............ H05B 45/12 |
| 10,827,576 B2 * | 11/2020 | McDonald ............ H01H 13/70 |
| 11,337,287 B2 * | 5/2022 | McDonald ............ H01H 13/70 |
| 11,805,589 B2 * | 10/2023 | McDonald ............ H05B 47/11 |
| 2003/0000817 A1 | 1/2003 | Farage et al. |
| 2004/0067087 A1 | 4/2004 | Al-Raheem |
| 2004/0163936 A1 | 8/2004 | Clegg et al. |
| 2006/0022951 A1 | 2/2006 | Hull |
| 2007/0139316 A1 | 6/2007 | Hyatt |
| 2007/0209912 A1 | 9/2007 | Clegg et al. |
| 2009/0174664 A1 | 7/2009 | Han et al. |
| 2009/0284459 A1 | 11/2009 | Wallener et al. |
| 2010/0302162 A1 | 12/2010 | Jo |
| 2010/0302169 A1 | 12/2010 | Pance et al. |
| 2010/0306683 A1 | 12/2010 | Pance et al. |
| 2011/0316441 A1 | 12/2011 | Huynh |
| 2012/0206369 A1 | 8/2012 | Chou et al. |
| 2013/0015985 A1 | 1/2013 | Peterson et al. |
| 2013/0201111 A1 | 8/2013 | Pance et al. |
| 2013/0313535 A1 | 11/2013 | Heo et al. |
| 2014/0001977 A1 | 1/2014 | Zacharchuk et al. |
| 2014/0246567 A1 * | 9/2014 | Goyal .................. H05B 47/11 250/214 SW |
| 2015/0203056 A1 * | 7/2015 | Adkins ................ H01H 23/025 29/622 |
| 2015/0334799 A1 | 11/2015 | Ascorra et al. |

\* cited by examiner

CONTROL DEVICE HAVING BUTTONS WITH MULTIPLE-LEVEL BACKLIGHTING

CROSS-REFERENCE TO RELATED APPLICATIONS

This application is a continuation of U.S. patent application Ser. No. 17/744,850, filed May 16, 2022; which is a continuation of U.S. patent application Ser. No. 17/082,567 filed Oct. 28, 2020, now U.S. Pat. No. 11,337,287, issued May 17, 2022; which is a continuation of U.S. patent application Ser. No. 16/783,682, filed Feb. 6, 2020, now U.S. Pat. No. 10,827,576 issued Nov. 3, 2020; which is a continuation of U.S. patent application Ser. No. 16/574,045, filed Sep. 17, 2019, now U.S. Pat. No. 10,595,374 issued Mar. 17, 2020; which is a continuation of U.S. patent application Ser. No. 16/244,556, filed Jan. 10, 2019, now U.S. Pat. No. 10,455,660 issued Oct. 15, 2019; which is a continuation of U.S. patent application Ser. No. 15/952,869, filed Apr. 13, 2018, now U.S. Pat. No. 10,206,260 issued Feb. 2, 2019; which is a continuation of U.S. patent application Ser. No. 15/680,516, filed Aug. 18, 2017, now U.S. Pat. No. 9,980,335 issued May 22, 2018; which is a continuation of U.S. patent application Ser. No. 14/850,315, filed Sep. 10, 2015, now U.S. Pat. No. 9,763,302 issued Sep. 12, 2017; which claims the benefit of U.S. Provisional Application No. 62/166,204, filed May 26, 2015, and U.S. Provisional Application No. 62/048,658, filed Sep. 10, 2014, the disclosures of which are incorporated herein by reference in their entireties.

BACKGROUND

Home automation systems, which have become increasingly popular, may be used by homeowners to integrate and control multiple electrical and/or electronic devices in their house. For example, a homeowner may connect appliances, lights, blinds, thermostats, cable or satellite boxes, security systems, telecommunication systems, and the like to each other via a wireless network. The homeowner may control these devices using a controller, a remote control device (e.g., such as a wall-mounted keypad), or user interface provided via a phone, a tablet, a computer, and the like directly connected to the network or remotely connected via the Internet. These devices may communicate with each other and the controller to, for example, improve their efficiency, their convenience, and/or their usability.

A control device may include a plurality of buttons where, for example, each button may control a different device and/or control a device to a preset level or intensity. It may be desirable to backlight the buttons of the control device so that a user may easily see them if the room is dark. Backlighting may also be used to indicate which of the buttons is currently set, for example, by setting that button to a higher intensity level than the others. However, variables such as ambient lighting conditions, button color, location and configuration of the control device, etc. may adversely affect how the backlighting is perceived by a user, for example, by reducing the readability of the buttons, reducing the contrast between selected and unselected buttons, and/or the like. As such, there exists a need for a backlight solution that provides consistent backlighting intensities and prevents bleed through of light between buttons regardless of the ambient light in the room, the color of the buttons, the configuration of the control device and/or the like.

SUMMARY

The present disclosure relates to a load control system for controlling the amount of power delivered to an electrical load, such as a lighting load, and more particularly, to a keypad having buttons with backlighting for use in a load control system.

A control device may include one or more buttons and have multiple-level backlighting. For example, the control device may include a control circuit, a first button, a second button, a third button, a first LED, a second LED, and a third LED. The first, second, and third LEDs may be configured to illuminate at least a portion of a respective one of the first, second, and third buttons. The control circuit may be electrically coupled to the first, second, and third buttons and the first, second, and third LEDs. The control circuit may be configured to illuminate the first LED to a first LED illumination intensity to illuminate the first button to approximately a first surface illumination intensity, illuminate the third LED to a second LED illumination intensity to illuminate the third button to approximately a second surface illumination intensity, and illuminate the second LED to a third LED illumination intensity to illuminate the second button to approximately the second surface illumination intensity. The second LED illumination intensity may be less than the first LED illumination intensity. The third LED illumination intensity may be less than the second LED illumination intensity, and the second surface illumination intensity may be less than the first surface illumination intensity.

The control device may include an ambient light detector. The ambient light detector may be configured to generate an ambient light detect signal. The control circuit may be configured to receive the ambient light detect signal and, based on the ambient light detect signal, determine an ambient light level in the room in which the control device is installed. One or more of the first LED illumination intensity, the second LED illumination intensity, or the third LED illumination intensity may be based at least in part on the ambient light level. The control circuit may be configured to determine illumination caused by at least one of the first LED, the second LED, or the third LED, and determine the ambient light level based on the illumination caused by at least one of the first LED, the second LED, or the third LED, for example, to compensate for the illumination of one or more LEDs in the ambient light detect signal. The control circuit may be configured to detect a change in the ambient light level, and adjust the first LED illumination intensity, the second LED illumination intensity, and/or the third LED illumination intensity based on the change in the ambient light level.

The first button may include indicia (e.g., text), and the second button may be closer to the indicia than the third button. The first button may be in a selected state. The first LED illumination intensity may be determined based on an active adjustment curve $DC_{ACTIVE}$, and the second LED illumination intensity and the third LED illumination intensity are based on an inactive adjustment curve $DC_{INACTIVE}$.

The control device may include a communication circuit configured to transmit control signals. For example, the control circuit may be electrically coupled to the communication circuit, and the control circuit may be configured to control at least one electrical load in response to at least one of the first button, the second button, or the third button receiving a user input. The control device may be configured to be electrically connected to an AC power source.

A control device may comprise a plurality of buttons, a plurality of LEDs, and a control circuit. Each of the LEDs may be configured to illuminate at least a portion of a respective button of the plurality of buttons. The control circuit may be electrically coupled to the plurality of buttons and the plurality of LEDs. The control circuit may be configured to determine that a button of the plurality of buttons is in a selected state. The control circuit may be configured to illuminate the LED of the selected button to a first LED illumination intensity to illuminate at least a portion of the selected button to approximately a first surface illumination intensity based on the button being in the selected state. The control circuit may be configured to illuminate the LEDs of each of the remaining buttons to respective illumination intensities to illuminate at least a portion of each of the remaining buttons to approximately a second surface illumination intensity. The second surface illumination intensity may be less than the first surface illumination intensity. The respective illumination intensities of the LEDs of each of the remaining buttons may be based on the relative position of each of the remaining plurality of buttons to the selected button. For example, the illumination intensity of an LED of a button that is closer to the selected button may be less than the illumination intensity of an LED of a button that is further from the selected button.

The control device may include an ambient light detector. The ambient light detector may be configured to generate an ambient light detect signal. The control circuit may be configured to receive the ambient light detect signal and, based on the ambient light detect signal, determine an ambient light level in the room in which the control device is installed. The first LED illumination intensity and the LED illumination intensities of the remaining buttons may be based at least in part on the ambient light level. The control circuit may be configured to determine illumination caused by one or more of the plurality of LEDs, and determine the ambient light level based on the illumination caused by the one or more of the plurality of LEDs.

DETAILED DESCRIPTION

Figure 1:
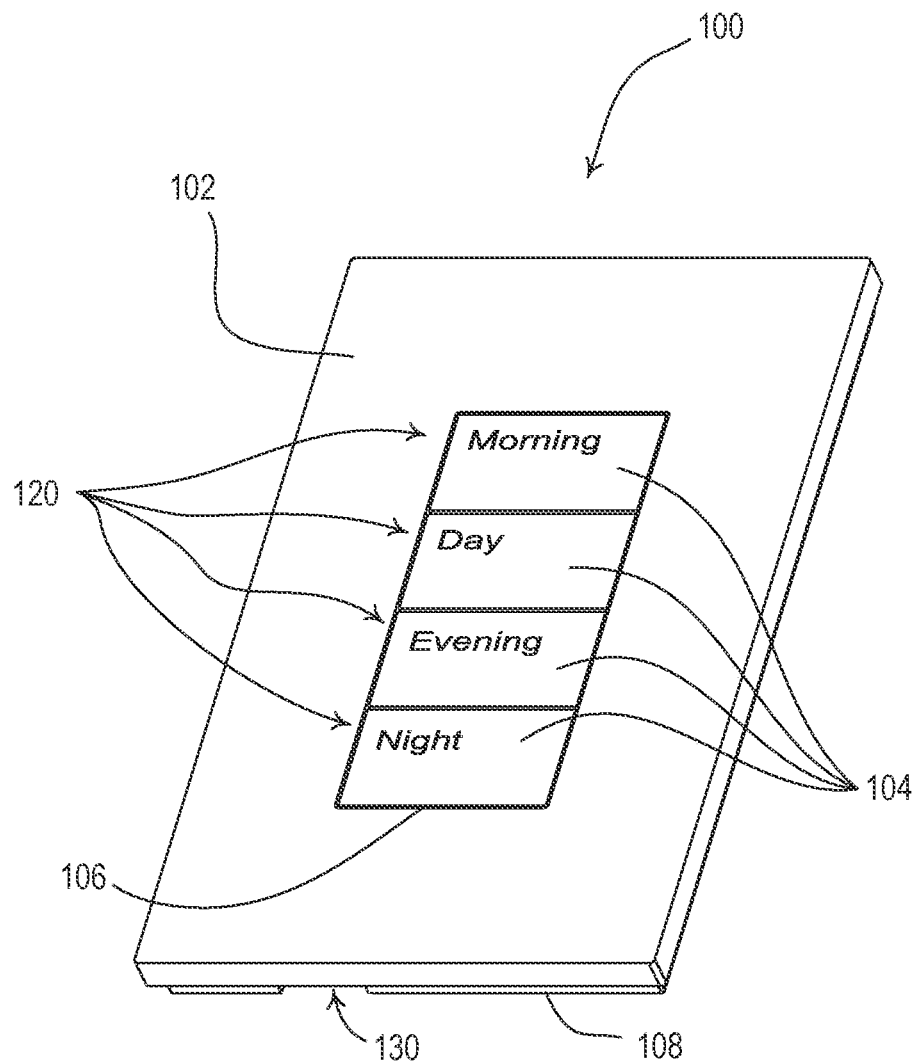
FIG. 1 is a perspective view of an example control device (e.g., a wall-mounted keypad) for use in a load control system for controlling the amount of power delivered to one or more electrical loads.

FIG. 1 is a perspective view of an example control device (e.g., a wall-mounted keypad 100) for use in a load control system for controlling the amount of power delivered to one or more electrical loads (e.g., lighting loads). The keypad 100 may comprise a faceplate 102 and a plurality of buttons 104 (e.g., four buttons). The plurality of buttons 104 may be received through an opening 106 of the faceplate 102. In one or more examples, the faceplate 102 and/or the buttons 104 may have a metallic surface. The faceplate 102 may be configured to be attached (e.g., snapped) to an adapter 108, which may be attached (e.g., using screws) to an enclosure (not shown) that houses the electrical circuitry of the control device. The keypad 100 may be electrically connected to an alternating-current (AC) power source (not shown) for receiving power.

The keypad 100 may be configured to transmit a digital message to one or more external load control device via a communication link for controlling respective electrical loads. The communication link may comprise a wired communication link or a wireless communication link, such as a radio-frequency (RF) communication link. Alternatively and/or additionally, the keypad 100 may comprise an internal load control circuit for controlling the power delivered to one or more electrical loads. For example, the keypad 100 may be configured to control AC power delivered from the AC power source to one or more electrical loads. Examples of load control systems having remote control devices, such as the keypad 100, are described in greater detail in commonly-assigned U.S. Pat. No. 6,803,728, issued Oct. 12, 2004, entitled SYSTEM FOR CONTROL OF DEVICES, and U.S. Patent Application Publication No. 2014/0001977, published Jan. 2, 2014, entitled LOAD CONTROL SYSTEM HAVING INDEPENDENTLY-CONTROLLED UNITS RESPONSIVE TO A BROADCAST CONTROLLER, the entire disclosures of which are hereby incorporated by reference.

The button 104 may comprise indicia, such as text 120, for indicating a preset (e.g., a lighting scene) or command that may be transmitted in response to an actuation of the button 104. Alternatively or additionally, the indicia on the button 104 may comprise an icon or symbol. A preset may relate to a particular mode of operation of an electrical load. For example, if the electrical load is a lighting load, the preset may relate to a particular lighting intensity level of the lighting load. For instance, a "morning" preset may set a lighting load at a medium-high lighting intensity level (e.g., 70% intensity), a "day" preset may set a lighting load at a high lighting intensity level (e.g., 100% intensity, or full on), an "evening" preset may set the lighting load at a medium-low intensity level (e.g., 30% intensity), and a "night" preset may set the lighting load at a low lighting intensity level (e.g., 10% intensity). The one or more presets or commands may be preconfigured and/or adjusted by the user through a commissioning mode of the keypad 100.

The buttons 104 may be backlit to allow the indicia to be read in a wide range of ambient light levels. Each button 104 may be made of a translucent (e.g., transparent, clear, and/or diffusive) material. For example, the buttons 104 may be made of plastic. The buttons 104 may be illuminated by one or more light sources (e.g., LEDs) located behind and/or to the side of each button (e.g., inside of the keypad 100). In addition, the buttons 104 may each have a metallic surface. Specifically, each button 104 may have a translucent body (not shown) and an opaque material, e.g., a metallic sheet (not shown), adhered to a front surface of the body. The text 120 may be etched into the metallic sheet of each button 104 (e.g., through a machining process, laser cutting, photo-etching, or other metal-removal process). The illumination from the LEDs may shine through the translucent body, but not through the metallic sheet, such that the text 120 of each button (e.g., that is etched away from the metallic sheet) is illuminated.

Alternatively or additionally, the buttons 104 may be coated with another type of opaque material, such as paint, and the text 120 may be etched into the paint. For example, the body 112 of the button 104 may be made of a translucent material, such as glass. The opaque material (e.g., such as paint) may be coated onto the rear surface 118 of the body 110 and the text 118 may be etched into paint on the rear surface of the body. Moreover, the faceplate 102 of the keypad 100 may comprise a metallic sheet and text or other indicia etched into the metallic plate and backlit by LEDs located behind the faceplate.

The keypad 100 may operate to backlight the buttons 104, such that the text 120 of a selected preset (e.g., an "active" preset) is illuminated to an active surface illumination intensity $L_{SUR1}$, and the text of each of the other presets (e.g., "inactive" presets) is illuminated to an inactive surface illumination intensity $L_{SUR2}$. The active surface illumination intensity $L_{SUR1}$ may be greater than the inactive surface illumination intensity $L_{SUR2}$, such that a user may identify which of the presets is selected based upon the intensity of the illumination of the text 120.

The ambient light level in the room in which the keypad 100 is installed may affect a user's ability to read the text 120 on the buttons 104. For example, if the contrast between the brightness of the illuminated text 120 and the brightness of the adjacent surface of the button 104 is too low, the illuminated text may appear washed out to the user. Factors such as the ambient light, the color of the buttons, the color of the walls, ceilings, and floors in the room, and the like may contribute. As such, the user may not be able to identify which of the presets is selected (e.g., "active") based on the intensity of the illumination of the text 120.

Accordingly, the keypad 100 may comprise an ambient light detection circuit, which may be located inside of the keypad and may be configured to measure the ambient light level in the room in which the keypad 100 is installed. For example, the keypad 100 may comprise an opening 130 in the adapter 108 through which the ambient light detection circuit may receive light to make a determination of the ambient light level in the room. Alternatively or additionally, the keypad 100 may comprise an opening in the faceplate 102 and/or one or more of the buttons 104 for allowing the ambient light detection circuit to receive light. In addition, the ambient light detection circuit may be configured to receive light through the gaps between the buttons 104 and/or through the material of the buttons. The ambient light detection circuit may also be positioned behind a semi-transparent or dark window and may be configured to receive light through the window. The keypad 100 may comprise a light pipe for directing light from outside of the keypad to the ambient light detection circuit.

Figure 2:
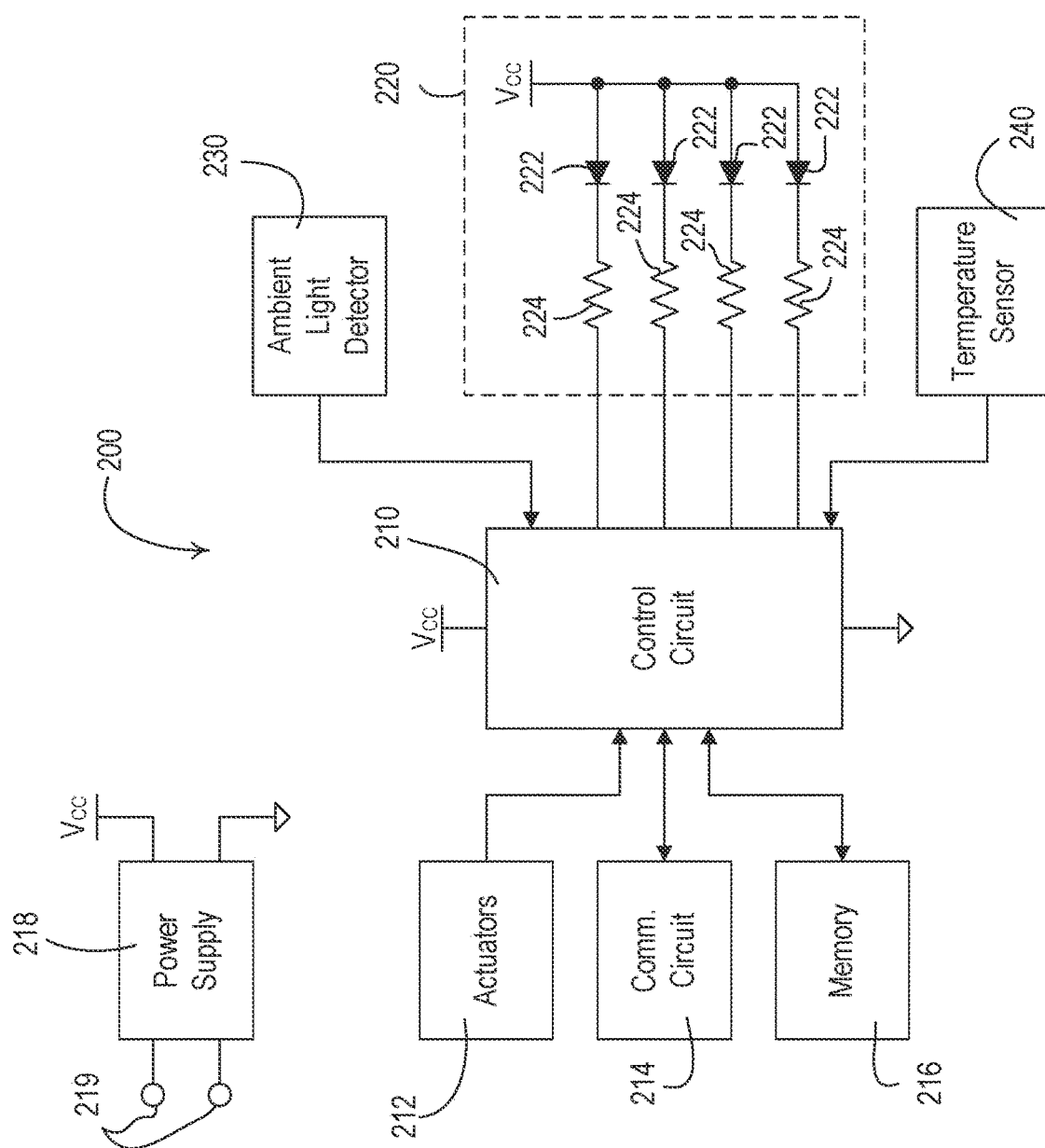
FIG. 2 is a simplified block diagram of an example control device.

The keypad 100 may be configured to adjust the active and inactive surface illumination intensities $L_{SUR1}$, $L_{SUR2}$ in response to the measured ambient light level. For example, the keypad 100 may be configured to increase the active and inactive surface illumination intensities $L_{SUR1}$, $L_{SUR2}$ if the ambient light level increases, and decrease the active and inactive FIG. 2 is a simplified block diagram of an example control device 200 that may be deployed as, for example, the keypad 100 shown in FIG. 1. The control device 200 may comprise a control circuit 210, which may include one or more of a processor (e.g., a microprocessor), a microcontroller, a programmable logic device (PLD), a field programmable gate array (FPGA), an application specific integrated circuit (ASIC), or any suitable processing device. The control device 200 may comprise one or more actuators 212 (e.g., mechanical tactile switches), which may be actuated in response to actuations of the buttons 104. The control circuit 200 may be coupled to the actuators 212 for receiving user inputs.

The control device 200 may further comprise a communication circuit 214, such as, a wired communication circuit or a wireless communication circuit (e.g., an RF transmitter coupled to an antenna for transmitting RF signals). The control circuit 210 may be coupled to the communication circuit 214 for transmitting digital messages in response to actuations of the actuators. Alternatively or additionally, the communication circuit 214 may include an RF receiver for receiving RF signals, an RF transceiver for transmitting and receiving RF signals, and/or an infrared (IR) transmitter for transmitter IR signals. In addition, the control circuit 210 may be configured to receive a digital message including, for example, a selected preset and/or the status of an electrical load controlled by an external load control device.

The control device 200 may also include a memory 216 communicatively coupled to the control circuit 210. The control circuit 210 may be configured to use the memory 216 for the storage and/or retrieval of, for example, commands and/or preset information to transmit in response to actuations of the buttons 104. The memory 216 may be implemented as an external integrated circuit (IC) or as an internal circuit of the control circuit 210. The memory 216 may include one or more components of volatile and/or non-volatile memory, in any combination.

The control device 200 may also comprise a power supply 218 for generating a direct-current (DC) supply voltage $V_{CC}$ for powering the control circuit 210, the communication circuit 214, the memory 216, and the other low-voltage circuitry of the control device. The power supply 218 may be coupled to an alternating-current (AC) power source or an external DC power source via electrical connections 219. Alternatively or additionally, the control device 200 may comprise an internal power source (e.g., one or more batteries) in place of or for supplying power to the power supply 218.

The control device 200 may further comprise a backlighting circuit 220 for illuminating indicia on one or more buttons (e.g., the buttons 104 of the keypad 100). For example, the backlighting circuit 220 may comprise four LEDs 222 coupled to respective ports on the control circuit 210 via respective resistors 224. The control circuit 210 is configured to individually turn each LED 222 on by pulling the respective port low towards circuit common, such that the LED is coupled between the supply voltage $V_{CC}$ and circuit common through the respective resistor 224. The control circuit 210 may be configured to dim the illumination of each LED 222, e.g., by pulse-width modulating the LED current conducted through each LED and adjusting a duty cycle $DC_{LED}$ of the respective pulse-width modulated LED current.

While the control device 200 shown in FIG. 2 has one LED 222 for illuminating each of the buttons 104, each LED illustrated in FIG. 2 may comprise one or more LEDs coupled in series or parallel. For example, each LED 222 in FIG. 2 may comprise four LEDs coupled in series. For example, the LEDs 222 may comprise white LEDs, e.g., part number LTW-C191DS5-LR, manufactured by LITE-ON. Each of the resistors 224 coupled in series with the respective LEDs 222 may have a resistance sized such that the maximum average magnitude of LED current may be approximately 20 mA, for example.

The control circuit 210 may be configured to backlight the buttons 104, such that the text 120 of a specific button (e.g., a button having text indicating a selected preset, herein referred to as "the selected button") is illuminated to an active surface illumination intensity $L_{SUR1}$, and the text of each of the other buttons (e.g., the non-selected or inactive buttons) is illuminated to an inactive surface illumination intensity $L_{SUR2}$. The inactive surface illumination intensity $L_{SUR2}$ may be less than the active surface illumination intensity $L_{SUR1}$. To illuminate the text of one of the buttons 104 to the active surface illumination intensity $L_{SUR1}$, the control circuit 210 may pulse-width modulate the LED current through the LED 222 behind the button using a first LED duty cycle $DC_{LED1}$ to cause the respective LED 222 to illuminate to a first LED illumination intensity $L_{LED1}$. To illuminate the text of one of the buttons 104 to the inactive surface illumination intensity $L_{SUR2}$, the control circuit 210 may pulse-width modulate the LED current through the LED 222 behind the button using a second LED duty cycle $DC_{LED2}$ (e.g., approximately 15%) to cause the respective LED 222 to illuminate to a second LED illumination intensity $L_{LED2}$, which may be less that the first LED illumination intensity $L_{LED1}$.

The control device 200 may further comprise an ambient light detector 230 (e.g., an ambient light detection circuit) for measuring an ambient light level $L_{AMB}$ in the room in which the control device 200 is installed. The ambient light detector 230 may generate an ambient light detect signal $V_{AMB}$, which may indicate the ambient light level $L_{AMB}$ and may be received by the control circuit 210. The control circuit 210 may receive the ambient light detect signal $V_{AMB}$ and determine the ambient light level $L_{AMB}$ accordingly. The ambient light level $L_{AMB}$ may include, for example, illumination from daylight, one or more lighting loads in the room, and/or the like.

The control circuit 210 may be configured to adjust the first and second LED illumination intensities $L_{LED1}$, $L_{LED2}$ in response to the measured ambient light level $L_{AMB}$ as determined from the ambient light detect signal $V_{AMB}$. For example, the control circuit 210 may be configured to adjust the first duty cycle $DC_{LED1}$ of the LED current through the LED 222 behind the button having the active preset in response to the measured ambient light level $L_{AMB}$, and to adjust the second duty cycle $DC_{LED2}$ of the LED current through each of the LEDs 222 behind the buttons having the inactive presets in response to the measured ambient light level $L_{AMB}$. For example, the control circuit 210 may be configured to increase the first and second LED illumination intensities $L_{LED1}$, $L_{LED2}$ to increase the active and inactive surface illumination intensities $L_{SUR1}$, $L_{SUR2}$ if the ambient light level increases. The control circuit 210 may be configured to decrease the first and second LED illumination intensities $L_{LED1}$, $L_{LED2}$ to decrease the active and inactive surface illumination intensities $L_{SUR1}$, $L_{SUR2}$ if the ambient light level decreases.

The control device 200 may account for reflection of light generated by the LEDs 222 of the buttons when determining the ambient light level $L_{AMB}$. For example, illumination from the LEDs 222 of the buttons may reflect off the wall, floor, ceiling, control device 200 itself, etc. and alter the measured ambient light level $L_{AMB}$. This may depend on the particular installation of the control device 200, the color of the ceiling, floor, and/or wall of the room, etc. For example, if an opening for the ambient light detector 230 is provided along the bottom of the faceplate (e.g., as is the case with opening 130 in FIG. 1), the LED 222 behind the bottom button may cause inaccuracies in the ambient light level $L_{AMB}$ calculated by the ambient light detector 230. In some instances, the illumination caused by the LEDs 222 may cause runaway in the ambient light level $L_{AMB}$ (e.g., the ambient light detector 230 may calculate the ambient light to include illumination from the LED 222, the control circuit 210 may increase the LED intensity to compensate for the ambient light, which in turn may increase the measured ambient light level $L_{AMB}$).

Accordingly, the control device 200 may calculate the part of the ambient light level $L_{AMB}$ caused by the LEDs 222 and remove the light caused by the LEDs 222 from the ambient light level $L_{AMB}$. For example, the control device 200 may calculate the part of the ambient light level $L_{AMB}$ caused by the LEDs 222 using the intensity level of the LEDs (e.g., which is known to the control circuit 210) and/or the degree of bleed and/or reflection of the respective LEDs 222 (e.g., which may be preconfigured in the control circuit 210 or determined during a commissioning step). Alternatively or additionally, the control device 200 may comprise an isolation element, such as light blocking foam, between the ambient light detector 230 and the LEDs 222 to prevent and/or reduce inaccuracies in the ambient light level $L_{AMB}$ caused by the illumination of the LEDs 222.

Illumination from the LED 222 behind the selected button may affect the surface illumination intensity of the adjacent buttons such that, for example, the surface illumination intensity of the adjacent buttons is not equal to the second surface illumination intensity $L_{SUR2}$ For example, the illumination from the LED 222 behind the selected button may shine directly on and/or be reflected or refracted onto the rear surfaces of the bodies of the adjacent buttons and cause the surface illumination intensity of the adjacent buttons to increase (e.g., and in turn, not be equal to the inactive surface illumination intensity $L_{SUR2}$). Accordingly, the control device 200 may be configured to adjust the illumination intensity of an LED 222 of a button based on its relative proximity to the selected button, for example, to cause all of the buttons other than the selected button to be illuminated to the inactive illumination intensity $L_{SUR2}$. For example, the control circuit 210 may be configured to decrease the intensities of the LEDs 222 of the buttons next to the selected button below the inactive LED illumination intensity $L_{LED2}$, such that the resulting illumination intensity of the text on the buttons is equal to the inactive surface illumination intensity $L_{SUR2}$.

As described, the control device 200 may be configured to adjust the illumination intensity of an LED 222 of a button based on its relative proximity to the selected button, for example, to ensure that the buttons other than the selected button are illuminated to the inactive illumination intensity $L_{SUR2}$. The control device 200 may utilize correction factors to determine the intensities of the LEDs 222 of the buttons other than the selected button. The correction factors may vary based on the intensity of the LEDs 222 of the selected and unselected buttons. For example, the ratio between the intensities of the selected and unselected buttons may be greater at lower light levels (e.g., up to a 15× difference) than at higher light levels (e.g., as low as a 3× difference), for example, because the human focal system may have less ability to differentiate between light at low intensity levels. And the ratios may be configured based on external factors, such as the color of the walls, ceiling, floors, keypad, etc.

The control device 200 may use a constant percentage as a correction factor to determine the intensities of the LEDs 222 of the buttons based on their relative position with respect to the selected button. In one or more embodiments, the control device 200 may perform a closed-loop commission operation (e.g., when the control device 200 is first installed) to determine one or more correction factors to used when determining the intensities of the LEDs 222 of the buttons based on their relative position to the selected button. Then during normal operation, the control circuit 210 may operate in an open-loop mode. When performing the closed-loop operation, the control device 200 may store each of the variables used when determining the correction factors (e.g., which button is the selected button, the various loads being on, the ambient light level $L_{AMB}$, etc.). Alternatively or additionally, commissioning may be performed via the use of a smart phone. For example, a picture of each combination of variables (e.g., with each button being the selected button) may be taken by a smart phone, sent to the cloud, and the control device 200 may receive one or more correction factors accordingly. In one or more examples, the control device 200 may use the ambient light level $L_{AMB}$ to determine and/or refine the intensities of the LEDs 222 of the buttons next to the selected button.

The specific location of the indicia on the buttons may affect how and which buttons are affected by the illumination from the LEDs 222 behind the selected button. For example, the text on the buttons 104 may be located towards the topside of the buttons, such as is shown in FIG. 1. In such instances, the illumination from the LED 222 behind the selected button may have a greater effect on the surface illumination of the button right above the selected button than the button below the selected button. For example, the LED 222 behind the selected button may cause a first predetermined amount of change $\Delta_{LED1}$ (e.g., approximately 9%) on the button below the selected button and a second predetermined amount of change $\Delta_{LED2}$ (e.g., approximately 15%) on the button above the selected button.

Accordingly, the control circuit 210 may be configured to adjust the illumination intensity of an LED 222 of a non-selected button based on its relative proximity to the indicia of the selected button. For example, the control circuit 210 may be configured to control the LED 222 of the button closest to the text of the selected button to an illumination intensity that is less than the illumination intensity of the LED 222 of the button that is further from the text of the selected button, to compensate for any reflection or fraction of light from the LED 222 of the selected button). For example, assuming the text is located towards the topside of the buttons, the control circuit 210 may be configured to control the LED 222 of the button below the selected button to a third LED illumination intensity $L_{LED3}$ and to control the LED 22 of the button above the selected button to a fourth LED illumination intensity $L_{LED4}$ that is less than the third LED illumination intensity $L_{LED3}$. For example, the control circuit 210 may be configured to control the illumination of each of the LEDs to the third and fourth LED illumination intensities $L_{LED3}$, $L_{LED4}$ by controlling the LED current through the respective LED using respective third and fourth LED duty cycles $DC_{LED3}$, $DC_{LED4}$ (e.g., approximately 5% and 1%, respectively). If the text on the buttons 104 is located towards the center of the buttons, the control circuit 210 may be configured to control the LEDs of the buttons below and above the selected button to the same LED illumination intensity.

The example values of the duty cycles used to control the illumination of the LEDs 222 to the first, second, third, and fourth LED illumination intensities $L_{LED1}$-$L_{LED4}$ provided herein are examples values, which for example, may be used when the bodies 110 of the buttons 104 are made from a translucent plastic. The values of the LED illumination intensities may vary depending upon the material of the buttons 104, the size, shape, and location of the indicia on the buttons 104, the number and size of LEDs 222, and/or the like.

The control device 200 may compensate for the degradation of the LEDs over their lifecycle. For example, using the ambient light detector 230, the control device 200 may determine that the light output from the LEDs of each button does not correspond to their set LED illumination intensity $L_{LED}$. The control device 200 may determine the actual light output of the LEDs based on the set LED illumination intensity $L_{LED}$ and the ambient light level $L_{AMB}$ measured by the ambient light detector 230. For example, the control device 200 may be placed in a commissioning mode (e.g., when the control device 200 is first installed), where the control device 200 determines the ambient light level $L_{AMB}$ with the LEDs off, then turns the LEDs behind each button on and measures the difference in ambient light level $L_{AMB}$ to determine a baseline value for the LED illumination intensity $L_{LED}$ of the LEDs of each button. Using that baseline value, the control device 200 may determine whether the actual light output from the LEDs of each button corresponds to the set LED illumination intensity $L_{LED}$. As the actual light output of the LEDs degrades over time, the control device 200 may increase the LED illumination intensity $L_{LED}$ to compensate for the degradation of the LEDs. The control device 200 may perform this test periodically (e.g., once every predetermined amount of time, such as every six months), when commissioned by a user, and/or the like.

Figure 3:
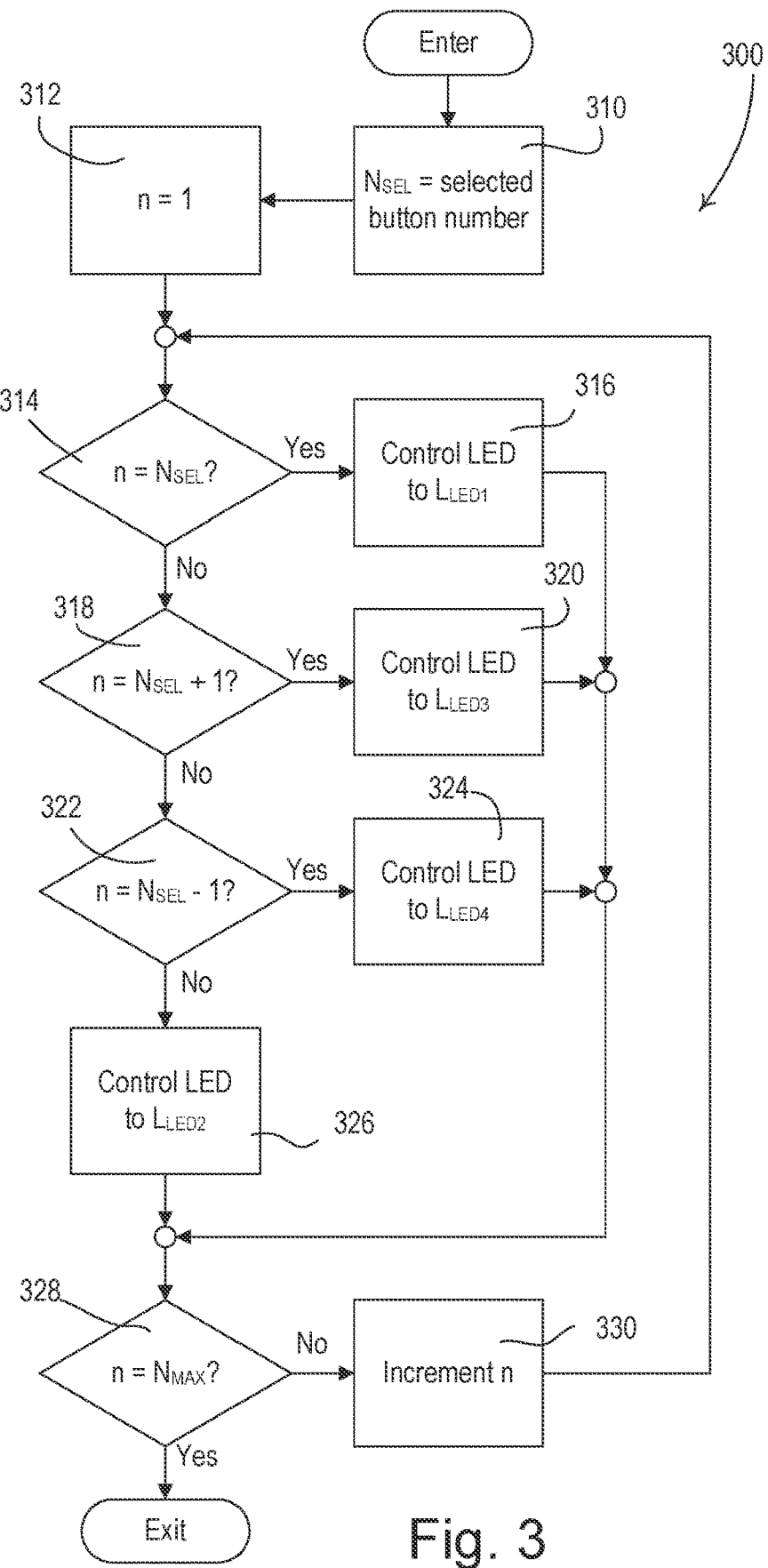
FIG. 3 is a simplified flowchart of an example backlighting procedure.

FIG. 3 is a simplified flowchart of an example backlighting procedure 300 that may be executed periodically by the control circuit 210 for backlighting the buttons 104. At 310, the control circuit 210 may set a selected-button number $N_{SEL}$ to be equal to the presently selected button (e.g., due to the presently selected preset or scene). For example, the number $N_{SEL}$ may be one for the top button, two for the second button, three for the third button, and four for the bottom button of the keypad 100 shown in FIG. 1. In other words, if the Evening button is the selected button, the control circuit 210 will set the number $N_{SEL}$ to three at 310. During the backlighting procedure 300, the control circuit 210 may step through the LEDs 222 behind each of the buttons 104 and determine the correct LED illumination intensity for each of the buttons. The control circuit 210 may use a variable n for stepping through the LEDs during the backlighting procedure 300. At 312, the control circuit 210 may initialize the variable n to one.

If the variable n is equal to the selected-button number $N_{SEL}$ at 314 (e.g., the present button is the selected button), the control circuit 210 may control the nth LED to the first LED illumination intensity $L_{LED1}$ at 316. If the variable n is equal to the selected-button number $N_{SEL}$ plus one at 318 (e.g., the button below the selected button), the control circuit 210 control the nth LED to the third LED illumination intensity $L_{LED3}$ at 320. If the variable n is equal to the selected-button number $N_{SEL}$ minus one at 322 (e.g., the button above the selected button), the control circuit 210 control the nth LED to the fourth LED illumination intensity $L_{LED4}$ at 324. The fourth LED illumination intensity $L_{LED4}$ may be less than the third LED illumination intensity $L_{LED3}$, for example, if the indicia on the buttons is located near the topside of the buttons as shown in FIG. 1. If the variable n is not equal to the selected-button number $N_{SEL}$ minus one at 322, the control circuit 210 may control the nth LED to the second LED illumination intensity $L_{LED2}$ at 326. In one or more examples, if the variable n is not equal to the selected-button number $N_{SEL}$ minus one at 322, the control circuit 210 may control the nth LED to an LED illumination intensity $L_{LED}$ that is dependent upon the button's relative location with respect to the selected-button at 326.

After setting the LED illumination intensity at 316, 320, 324, and 326, the control circuit 210 may determine if the variable n is equal to a maximum number $N_{MAX}$ (e.g., the number of buttons 104 on the keypad 100) at 328. If the variable n is not equal to the maximum number $N_{MAX}$ at 328, the control circuit 210 increments the variable n by one at 330, and the procedure 300 loops around the set the LED illumination intensity for the next LED. If the variable n is equal to the maximum number $N_{MAX}$ at 328, the procedure 300 exits.

As previously mentioned, the ambient light level in the room in which the keypad is installed may affect a user's ability to read the text on the buttons. Accordingly, the control circuit 210 may be configured to adjust the first, second, third, and fourth LED illumination intensities $L_{LED1}$, $L_{LED2}$, $L_{LED3}$, $L_{LED4}$ by adjusting the respective duty cycle $DC_{LED1}$, $DC_{LED2}$, $DC_{LED3}$, $DC_{LED4}$ in response to the ambient light level $L_{AMB}$ measured by the ambient light detector circuit 230. The control circuit 210 may adjust the selected (e.g., or active) button according to one adjustment curve and the unselected (e.g., or inactive) buttons according to a different adjustment curve. For example, the control circuit 210 may be configured to adjust the first duty cycle $DC_{LED1}$ of the LED current through the LED behind the button having the active preset in response to the measured ambient light level $L_{AMB}$ according an active LED adjustment curve $DC_{ACTIVE}$, and to adjust the second duty cycle $DC_{LED2}$ of the LED current through each of the LEDs behind the buttons having the inactive presets in response to the measured ambient light level $L_{AMB}$ according an inactive LED adjustment curve $DC_{INACTIVE}$. The third and fourth LED duty cycles $DC_{LED3}$, $DC_{LED4}$ may be calculated using the inactive duty cycle curve $DC_{INACTIVE}$ and/or the second LED duty cycle $DC_{LED2}$. The active LED adjustment curve $DC_{ACTIVE}$ and the inactive LED adjustment curve $DC_{INACTIVE}$ may be stored in the memory 216.

Figure 4:
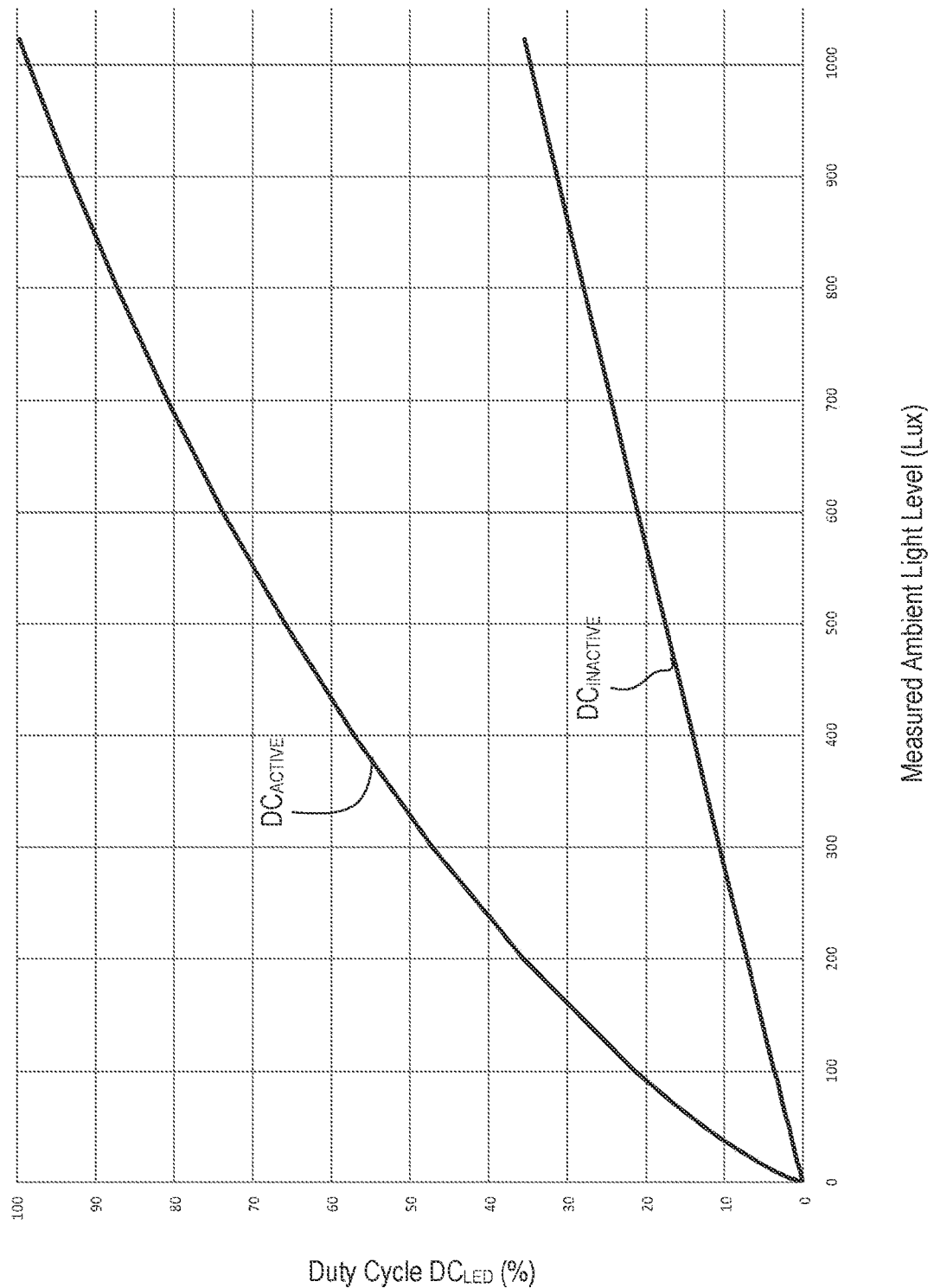
FIG. 4 illustrates example adjustment curves for adjusting duty cycles of currents conducted through light-emitting diodes illuminating buttons of a control device in response to a measured ambient light level on a linear scale.
Figure 5:
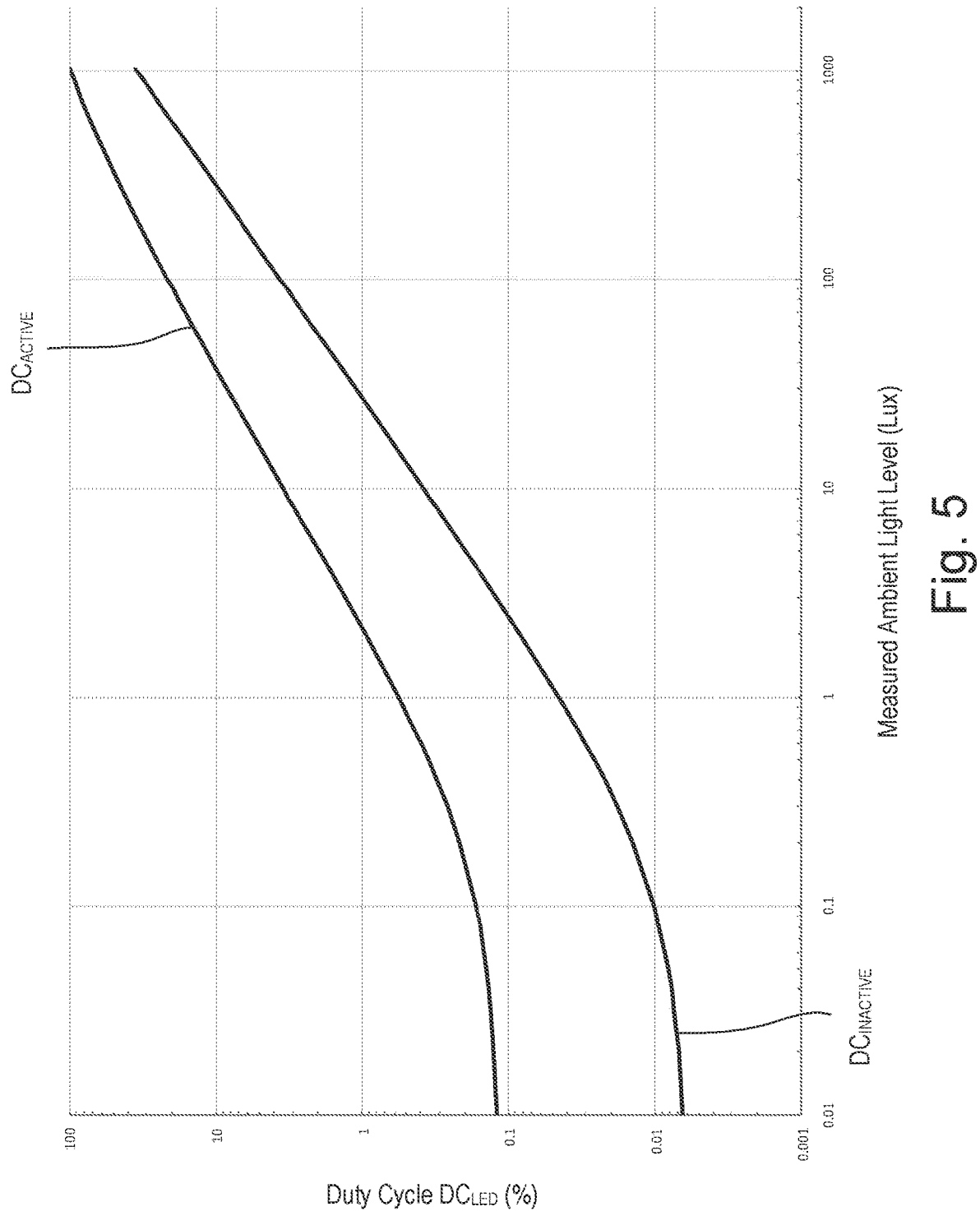
FIG. 5 illustrates example adjustment curves for adjusting duty cycles of currents conducted through light-emitting diodes illuminating buttons of a control device in response to a measured ambient light level on a logarithmic scale.

FIGS. 4 and 5 illustrate example active and inactive adjustment curves $DC_{ACTIVE}$, $DC_{INACTIVE}$ for adjusting the duty cycle $DC_{LED}$ of the LED current through each of the LEDs in response to the measured ambient light level $L_{AMB}$. FIG. 4 shows an example active and inactive adjustment curves $DC_{ACTIVE}$ and $DC_{INACTIVE}$ on a linear scale, while FIG. 5 shows an example active and inactive adjustment curves $DC_{ACTIVE}$ and $DC_{INACTIVE}$ on a logarithmic scale. For example, if the measured ambient light level $L_{AMB}$ is approximately 500 Lux, the first duty cycle $DC_{LED1}$ of the LED current through the LED behind the control button having the active preset may be controlled to approximately 66%, while the second duty cycle $DC_{LED2}$ of the LED current through each of the LEDs behind the control buttons having the inactive presets may be controlled to approximately 17%.

The human eye has a more difficult time discerning contrast in low ambient light levels than in high ambient light levels. Thus, the first duty cycle $DC_{LED1}$ of the active adjustment curve $DC_{ACTIVE}$ may be, for example, over ten times greater than the second duty cycle $DC_{LED2}$ of the inactive adjustment curve $DC_{INACTIVE}$ near a minimum ambient light level $L_{AMB-MIN}$ (e.g., approximately 0 Lux), for example, as shown in FIGS. 4 and 5. Near a maximum ambient light level $L_{AMB-MAX}$ (e.g., approximately 1000 Lux), the first duty cycle $DC_{LED1}$ of the active adjustment curve $DC_{ACTIVE}$ may be, for example, approximately three times greater than the second duty cycle $DC_{LED2}$ of the inactive adjustment curve $DC_{INACTIVE}$.

The active and inactive adjustment curves $DC_{ACTIVE}$ and $DC_{INACTIVE}$ are non-linearly related (e.g., not proportional), for example, as illustrated in FIGS. 4 and 5. The difference between the active and inactive adjustment curves $DC_{ACTIVE}$ and $DC_{INACTIVE}$ may be non-linear as the ambient light level ranges from the minimum ambient light level $L_{AMB-MIN}$ to the maximum ambient light level $L_{AMB-MAX}$. The values of the active and inactive adjustment curves $DC_{ACTIVE}$ and $DC_{INACTIVE}$ may be chosen so that the button 104 having the text of the active preset may be visually distinguished (e.g., visually brighter) than the buttons 104 having the text of the inactive presets across a range of typical ambient light levels (e.g., between the minimum ambient light level $L_{AMB}$-MIN and the maximum ambient light level $L_{AMB-MAX}$). The values of the active and inactive adjustment curves $DC_{ACTIVE}$ and $DC_{INACTIVE}$ may also be chosen so that the text 120 on both the button 104 having the text of the active preset and the buttons 104 having the text of the inactive presets may be read across a range of typical ambient light levels (e.g., between the minimum ambient light level $L_{AMB-MIN}$ and the maximum ambient light level $L_{AMB-MAX}$).

Figure 6:
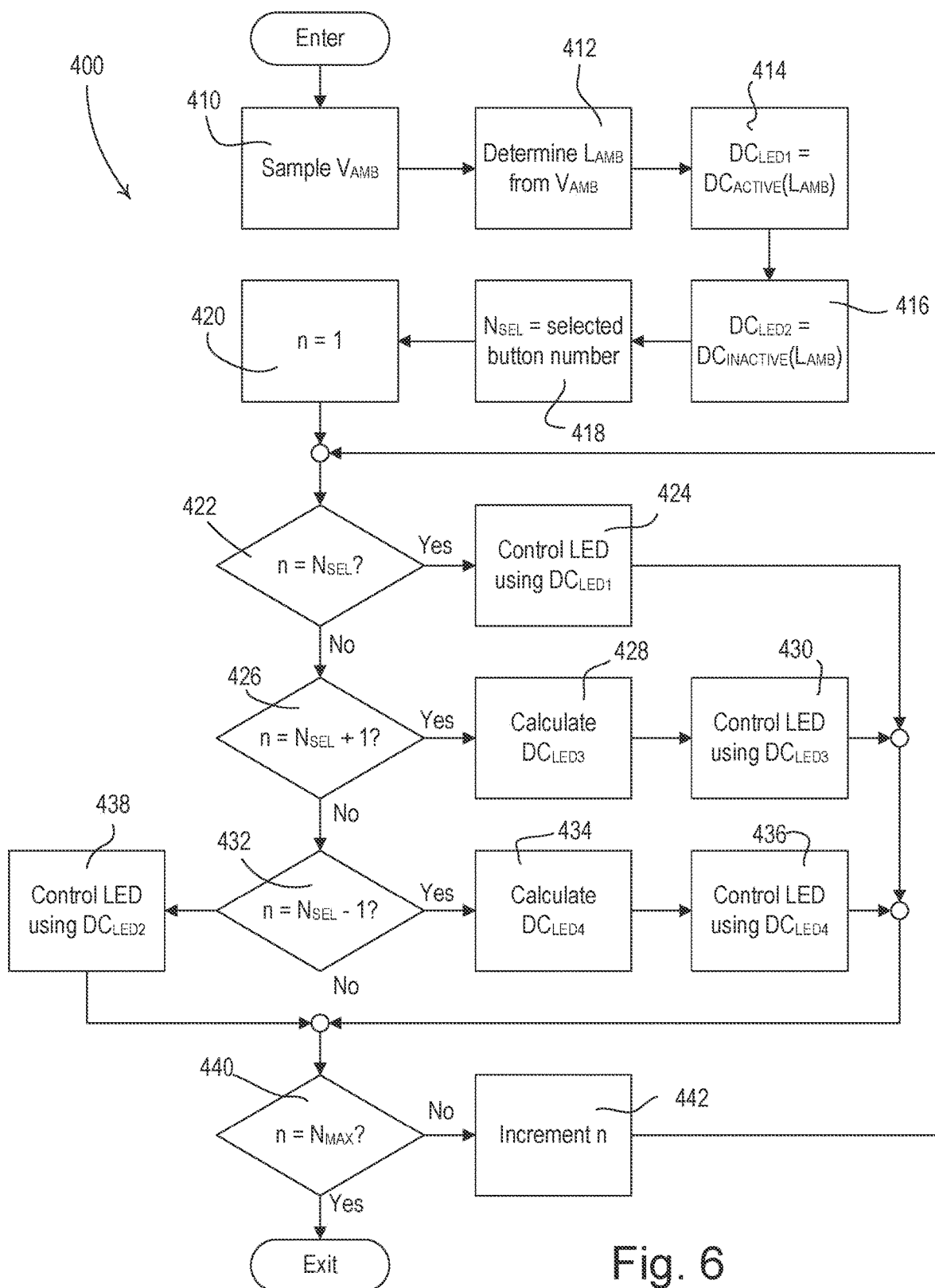
FIG. 6 is a simplified flowchart of another example backlighting procedure.

FIG. 6 is a simplified flowchart of an example backlighting procedure 400 that may be executed periodically by a control circuit (e.g., the control circuit 210) for backlighting a plurality of buttons of a control device (e.g., the buttons 104 of the keypad 100). The control circuit 210 may sample the ambient light detect signal $V_{AMB}$ at 410. The control circuit 210 may determine the measured ambient light level $L_{AMB}$ using the magnitude of the ambient light detect signal $V_{AMB}$ at 412. The control circuit 210 may determine the first LED duty cycle $DC_{LED1}$ from the active adjustment curve $DC_{ACTIVE}$ (e.g., as shown in FIG. 4 or 5) using the measured ambient light level $L_{AMB}$ at 414. The control circuit may determine the second LED duty cycle $DC_{LED2}$ from the inactive adjustment curve $DC_{ACTIVE}$ using the measured ambient light level $L_{AMB}$ at 416. At 418, the control circuit 210 may set a selected-button number $N_{SEL}$ to be equal to the presently selected button (e.g., the button having text indicating the active or selected preset or scene). During the backlighting procedure 400, the control circuit 210 may step through the LEDs 222 behind each of the buttons 104 and determine the correct LED illumination intensity for each of the buttons. The control circuit 210 may use a variable n for stepping through the LEDs during the backlighting procedure 400. At 420, the control circuit 210 may initialize the variable n to one.

If the variable n is equal to the selected-button number $N_{SEL}$ at 422 (e.g., the present button is the selected button), the control circuit 210 may control the LED current conducted through the LED behind the selected button using the first LED duty cycle $DC_{LED1}$ at 424. If the variable n is equal to the selected-button number $N_{SEL}$ plus one at 426 (e.g., the button below the selected button), the control circuit 210 may calculate the third LED duty cycle $DC_{LED3}$ at 428. For example, the control circuit 210 may calculate the third LED duty cycle $DC_{LED3}$ based at least in part on the first predetermined amount of change $\Delta_{LED1}$ caused by the LED behind the selected button on the button below the selected button, e.g., $$DC_{LED3} = DC_{LED2} - (DC_{LED1} - DC_{LED2}) \cdot \Delta_{LED1}$$

At 430, the control circuit 210 may pulse-width modulate the LED current conducted through the LED behind the button below the selected button using the third LED duty cycle $DC_{LED3}$.

If the variable n is equal to the selected-button number $N_{SEL}$ minus one at 432 (e.g., the button above the selected button), the control circuit 210 may calculate the fourth LED duty cycle $DC_{LED4}$ at 434. For example, the control circuit 210 may calculate the fourth LED duty cycle $DC_{LED3}$ based at least in part on the second predetermined amount of change $\Delta_{LED2}$ caused by the LED behind the selected button on the button above the selected button, e.g., $$DC_{LED4} = DC_{LED2} - (DC_{LED1} - DC_{LED2}) \cdot \Delta_{LED2}$$

At 436, the control circuit 210 may pulse-width modulate the LED current conducted through the LED behind the button above the selected button using the fourth LED duty cycle $DC_{LED4}$. If the variable n is not equal to the selected-button number $N_{SEL}$ minus one at 432, the control circuit 210 may pulse-width modulate the LED current conducted through the nth LED using the second LED duty cycle $DC_{LED2}$ at 438. In one or more examples, if the variable n is not equal to the selected-button number $N_{SEL}$ minus one at 432, the control circuit 210 may control the nth LED to an LED illumination intensity $L_{LED}$ that is dependent upon the button's relative location with respect to the selected-button at 438.

After setting the LED illumination intensity at 424, 430, 436, and 438, the control circuit 210 may determine if the variable n is equal to a maximum number $N_{MAX}$ (e.g., the number of buttons 104 on the keypad 100) at 440. If the variable n is not equal to the maximum number $N_{MAX}$ at 440, the control circuit 210 may increment the variable n by one at 442, before the procedure 400 loops around the set the LED illumination intensity for the next LED. If the variable n is equal to the maximum number $N_{MAX}$ at 440, the procedure 400 may simply exit.

The invention claimed is:

1. A keypad to control one or more electric load devices, the keypad comprising:
    a plurality of buttons, each of the plurality of buttons including at least one respective indicia;
    a plurality of illumination devices, each of the plurality of illumination devices associated with a respective one of the plurality of buttons and each of the plurality of illumination devices to backlight the at least one indicia included on the respective button; and
    control circuitry communicatively coupled to each of the plurality of buttons and each of the plurality of illumination devices, the control circuitry to, responsive to a selection of one of the buttons:
        cause each of the plurality of illumination devices to illuminate a rear surface of a respective one of a plurality of buttons included in a keypad at a first illumination level;
        receive an input indicative of a selection of one of a plurality of buttons included in a keypad; and
        responsive to receipt of the input indicative of the selection of one of the plurality of buttons included in the keypad;
            cause the illumination device associated with the selected button to illuminate the rear surface of the selected button at a second illumination level; and
            cause the illumination devices associated with the non-selected buttons to illuminate the rear surfaces of the non-selected buttons at a third illumination level that is less than the second illumination level.

2. The keypad of claim 1 wherein to cause the illumination devices associated with the non-selected buttons to illuminate the rear surfaces of the non-selected buttons at the third illumination level, the control circuitry to further:
    cause the illumination devices associated with the non-selected buttons to backlight the indicia on each of the non-selected buttons to the third level of illumination;
    wherein the third level of illumination for each of the non-selected buttons is determined based on the proximity of the respective non-selected button to the selected button.

3. The keypad apparatus of claim 1, further comprising:
    at least one ambient light sensing circuit communicatively coupled to the control circuitry, the at least one ambient light sensing circuit to provide information indicative of a measured ambient light level to the control circuitry;
    wherein the control circuitry to further:
        adjust the first level of illumination using the received information indicative of the measured ambient light level;
        adjust the second level of illumination using the received information indicative of the measured ambient light level; and
        adjust the third illumination level using the received information indicative of the measured ambient light level.

4. The keypad of claim 3 wherein to cause the illumination device associated with the selected button to illuminate the rear surface of the selected button at the second illumination level, the control circuitry to further:
    cause the illumination device associated with the selected button to backlight the selected button at the second illumination level;
    wherein the second level of illumination is determined using the measured ambient light level and an active button adjustment curve that includes the first illumination level as a function of the measured ambient light level.

5. The keypad of claim 4 wherein to cause the illumination devices associated with the non-selected buttons to illuminate the rear surfaces of the non-selected buttons at the third illumination level, the control circuitry to further:
    cause the illumination devices associated with each of the non-selected buttons to backlight the indicia on the non-selected button to the third illumination level;
    wherein the third illumination level is determined using the measured ambient light level and an inactive button adjustment curve that includes the third illumination level as a function of the measured ambient light level.

6. The keypad of claim 3 wherein the control circuitry to further:
    determine a contribution of the plurality of illumination devices to the ambient light level; and
    correct the measured ambient light level using the determined contribution of the plurality of illumination devices to the ambient light level.

7. A method to control one or more electric load devices using a keypad, the method comprising:
    causing each of a plurality of illumination devices to illuminate a rear surface of a respective one of a plurality of buttons included in a keypad at a first illumination level;

wherein each of the plurality of buttons includes at least one indicia backlit by the illumination device associated with the respective button;

receiving, by electric load controller control circuitry, an input indicative of a selection of one of a plurality of buttons included in a keypad; and responsive to receipt of the input indicative of the selection of one of the plurality of buttons included in the keypad;

causing, by the electric load controller control circuitry, the illumination device associated with the selected button to illuminate the rear surface of the selected button at a second illumination level; and causing, by the electric load controller control circuitry, the illumination devices associated with the non-selected buttons to illuminate the rear surface of the non-selected button at a third illumination level that is less than the second illumination level.

8. The method of claim 7 wherein causing the illumination devices associated with the non-selected buttons to illuminate the rear surfaces of the non-selected buttons at the third illumination level, further comprises:

causing, by the electric load controller control circuitry, the illumination devices associated with the non-selected buttons to backlight the indicia on each of the non-selected buttons at the third level of illumination;

wherein the third level of illumination for each of the non-selected buttons is determined based on the proximity of the respective non-selected button to the selected button.

9. The method of claim 7, further comprising:

receiving, by the electric load controller control circuitry, a signal indicative of a measured ambient light level from ambient light sensing circuitry;

adjusting, by the electric load controller control circuitry, the first illumination level using the received information indicative of the measured ambient light level;

adjusting, by the electric load controller control circuitry, the second level of illumination using the received information indicative of the measured ambient light level; and adjusting, by the electric load controller control circuitry, the third level of illumination using the received information indicative of the measured ambient light level.

10. The method of claim 9 wherein causing the illumination device associated with the selected button to illuminate the rear surface of the selected button at the second illumination level further comprises:

causing, by the electric load controller control circuitry, the illumination device associated with the selected button to backlight the selected button at the second illumination level;

wherein the second level of illumination is determined using the measured ambient light level and an active button adjustment curve that includes the first illumination level as a function of the measured ambient light level.

11. The method of claim 10 wherein causing the illumination devices associated with the non-selected buttons to illuminate the rear surfaces of the non-selected buttons at the third illumination level further comprises:

causing, by the electric load controller control circuitry, the illumination devices associated with each of the non-selected buttons to backlight the indicia on the non-selected button to the third illumination level;

wherein the third illumination level is determined using the measured ambient light level and an inactive button adjustment curve that includes the third illumination level as a function of the measured ambient light level.

12. The method of claim 9, further comprising:

determining, by the electric load controller control circuitry, a contribution of the plurality of illumination devices to the ambient light level; and correcting, by the electric load controller control circuitry, the measured ambient light level using the determined contribution of the plurality of illumination devices to the ambient light level.

13. A non-transitory, machine-readable, storage device that includes instructions that, when executed by electric load controller control circuitry, cause the electric load controller control circuitry to:

cause each of a plurality of illumination devices to illuminate a rear surface of a respective one of a plurality of buttons included in a keypad at a first illumination level;

wherein each of the plurality of buttons includes at least one indicia backlit by the illumination device associated with the respective button;

receive an input indicative of a selection of one of a plurality of buttons included in a keypad; and responsive to receipt of the input indicative of the selection of one of the plurality of buttons included in the keypad;

cause the illumination device associated with the selected button to illuminate the rear surface of the selected button at a second illumination level; and cause the illumination devices associated with the non-selected buttons to illuminate the rear surface of the non-selected button at a third illumination level that is less than the second illumination level.

14. The non-transitory, machine-readable, storage device of claim 13 wherein the instructions that cause the electric load controller control circuitry to cause the illumination devices associated with the non-selected buttons to illuminate the rear surfaces of the non-selected buttons at the third illumination level, further cause the electric load controller control circuitry to:

cause the illumination devices associated with the non-selected buttons to backlight the indicia on each of the non-selected buttons at the third level of illumination;

wherein the third level of illumination for each of the non-selected buttons is determined based on the proximity of the respective non-selected button to the selected button.

15. The non-transitory, machine-readable, storage device of claim 13 wherein the instructions, when executed by the electric load controller control circuitry, further cause the electric load controller control circuitry to:

receive a signal indicative of a measured ambient light level from ambient light sensing circuitry;

adjust the first illumination level using the received information indicative of the measured ambient light level;

adjust the second level of illumination using the received information indicative of the measured ambient light level; and adjust the third level of illumination using the received information indicative of the measured ambient light level.

16. The non-transitory, machine-readable, storage device of claim 15 wherein the instructions that cause the electric load controller control circuitry to cause the illumination device associated with the selected button to illuminate the rear surface of the selected button at the second illumination level further cause the electric load controller control circuitry to:

cause the illumination device associated with the selected button to backlight the selected button at the second illumination level;

wherein the second level of illumination is determined using the measured ambient light level and an active button adjustment curve that includes the first illumination level as a function of the measured ambient light level.

17. The method of claim 10 wherein causing the illumination devices associated with the non-selected buttons to illuminate the rear surfaces of the non-selected buttons at the third illumination level further comprises:

causing, by the electric load controller control circuitry, the illumination devices associated with each of the non-selected buttons to backlight the indicia on the non-selected button to the third illumination level;

wherein the third illumination level is determined using the measured ambient light level and an inactive button adjustment curve that includes the third illumination level as a function of the measured ambient light level.

18. The non-transitory, machine-readable, storage device of claim 15 wherein the instructions, when executed by the electric load controller control circuitry, further cause the electric load controller control circuitry to:

determine a contribution of the plurality of illumination devices to the ambient light level; and correct the measured ambient light level using the determined contribution of the plurality of illumination devices to the ambient light level.

* * * * *